(12) United States Patent
Chen et al.

(10) Patent No.: US 11,650,508 B2
(45) Date of Patent: May 16, 2023

(54) PLASMA POSITION CONTROL FOR EXTREME ULTRAVIOLET LITHOGRAPHY LIGHT SOURCES

(71) Applicant: TAIWAN SEMICONDUCTOR MANUFACTURING CO., LTD., Hsinchu (TW)

(72) Inventors: Ssu-Yu Chen, New Taipei (TW); Hsin-Feng Chen, Yilan (TW); Chi Yang, Tainan (TW); Li-Jui Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 123 days.

(21) Appl. No.: 16/900,735

(22) Filed: Jun. 12, 2020

(65) Prior Publication Data
US 2021/0389678 A1   Dec. 16, 2021

(51) Int. Cl.
G03F 7/20   (2006.01)

(52) U.S. Cl.
CPC ............................... G03F 7/70033 (2013.01)

(58) Field of Classification Search
CPC ..... G03F 7/70033; H05G 2/006; H05G 2/008
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2004/0264512 A1* | 12/2004 | Hartlove | H05G 2/008 372/5 |
| 2010/0090133 A1* | 4/2010 | Endo | H05G 2/00 250/493.1 |
| 2018/0352641 A1* | 12/2018 | Nishimura | G01J 1/429 |
| 2020/0344868 A1* | 10/2020 | Purvis | H05G 2/008 |
| 2021/0263422 A1* | 8/2021 | Rafac | G03F 7/70133 |
| 2022/0011675 A1* | 1/2022 | Cheng | H05G 2/005 |

\* cited by examiner

Primary Examiner — Deoram Persaud
(74) Attorney, Agent, or Firm — Maschoff Brennan

(57) ABSTRACT

A system for controlling plasma position in extreme ultraviolet lithography light sources may include a vacuum chamber, a droplet generator to dispense a stream of droplets into the vacuum chamber, wherein the droplets are formed from a metal material, a laser light source to fire a plurality of laser pulses, including at least a first pulse and a second pulse, into the vacuum chamber, a sensor to detect an observed plasma position within the chamber, wherein the observed plasma position comprises a position at which the plurality of laser pulses vaporizes a droplet of the stream of droplets to produce a plasma that emits extreme ultraviolet radiation, and a first feedback loop connecting the sensor to the laser light source, wherein the first feedback loop adjusts a time delay between the first and second pulses to minimize a difference between the observed plasma position and a target plasma position.

20 Claims, 4 Drawing Sheets

PLASMA POSITION CONTROL FOR EXTREME ULTRAVIOLET LITHOGRAPHY LIGHT SOURCES

BACKGROUND

Extreme ultraviolet (EUV) lithography is an optical lithography technique in which the scanner uses light in the extreme ultraviolet region (e.g., spanning wavelengths of approximately one to one hundred nanometers). One specific type of EUV lithography, referred to as laser-produced plasma (LPP) EUV lithography, uses a light source to convert a molten metal such as tin into a highly ionized plasma that emits EUV radiation. An LPP EUV light source may generally include a vacuum chamber, a laser power source (e.g., a carbon dioxide laser), and a droplet generator. The droplet generator dispenses droplets of the molten metal into the vacuum chamber, and, when the droplets reach a predefined position in the vacuum chamber, the laser power source fires a series of laser pulses into the vacuum chamber. When the laser pulses hit a droplet, the droplet is vaporized into a plasma which emits the EUV radiation.

The EUV radiation is subsequently guided, using a series of optics (e.g., including multilayer mirrors), into the scanner, and then used to project a pattern (etched into a photomask) onto a silicon wafer. The EUV process can be used to fabricate a high resolution pattern of lines onto the silicon wafer, potentially at a scale of seven nanometers or beyond.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
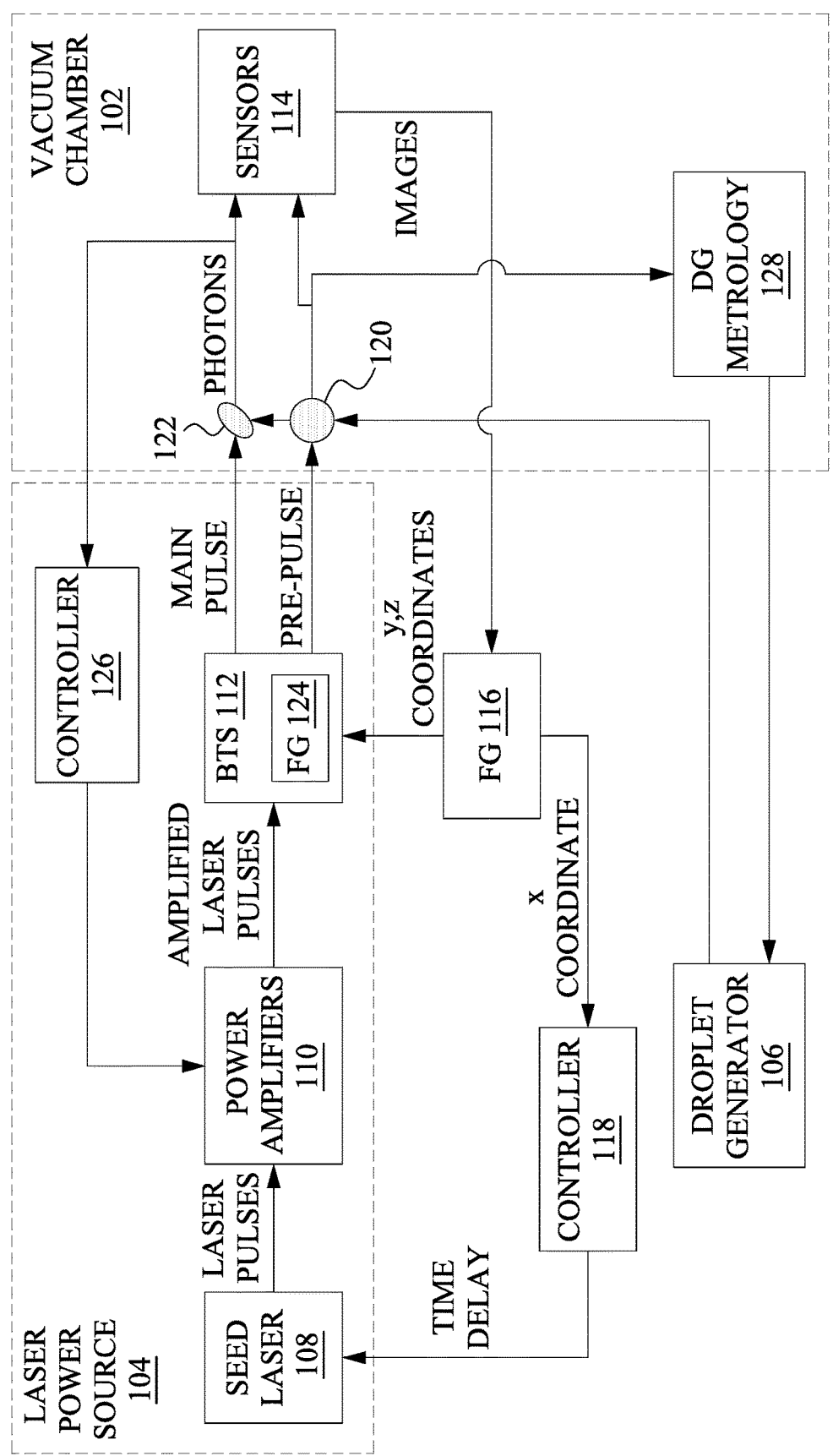
FIG. 1 is a schematic diagram illustrating one example of an extreme ultraviolet lithography light source, according to examples of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In one example, the present disclosure provides plasma position control for extreme ultraviolet (EUV) light sources. As discussed above, an EUV light source may generally include a vacuum chamber, a laser power source, and a droplet generator. The droplet generator dispenses droplets of molten metal (e.g., tin) into the vacuum chamber, and, when the droplets reach a predefined position in the vacuum chamber, the laser power source fires a series of laser pulses into the vacuum chamber. When a first pulse (also referred to as a "pre-pulse") hits a droplet, the generally spherical droplet takes on a flattened, pancake-like shape. When a second pulse (also referred to as a "main pulse") hits the pancake, the pancake is vaporized into a plasma which emits EUV radiation. The EUV radiation may subsequently be used to project a pattern formed in a photomask onto a silicon wafer, and the pattern may be etched into the wafer.

The precision with which the laser hits the droplets is a major determining factor in the conversion efficiency of the EUV light source (i.e., how much of the laser power is converted into EUV radiation). State of the art LPP light sources have been shown to exhibit conversion efficiencies of less than ten percent. Thus, these light sources consume a large amount of energy, but manage to produce a relatively small amount of light for the power consumed. Conventional LPP light sources include control systems to fix the droplet position and the position of the laser relative to the droplet individually, but do not allow for the plasma position (e.g., the position in the vacuum chamber at which the main pulse hits the pancake to produce the plasma) to be fixed. Thus, over time, conditions such as drift of the laser beam or changes in the plasma position may affect the precision with which the laser hits the droplets, and therefore reduce the conversion efficiency of the light source.

Examples of the present disclosure provide feedback controls to fix the plasma position in the vacuum chamber of an EUV light source. In one example, in addition to calculating the droplet position from the return beam of the pre-pulse (i.e., the first laser pulse that hits the spherical droplet) as is conventionally done, the present disclosure also calculates the droplet position from the return beam of the main pulse (i.e., the second laser pulse that hits the pancake). The x, y, and z coordinates extracted from the return beams may be used as feedback to control the laser power source. For instance, the x coordinate (i.e., the position along a line that is parallel to the direction in which the droplets flow) may be used to adjust a time delay between the pre-pulse and the laser pulse, which consequently will adjust the position at which the pancake is vaporized into plasma (e.g., by allowing the pancake to fall a shorter distance or a longer distance before vaporization). In addition, the y and z coordinates may be used to adjust the optics (e.g., mirrors) that are used to steer the beams of the laser pulses relative to the droplet and the pancake. The adjustments of the time delay and the beam steering optics, based on observed plasma positions within the vacuum chamber, may allow the plasma position to remain fixed at some target position. In other words, the adjustments may work to continuously minimize a delta or difference between the observed plasma position and the target plasma position, so that the plasma position remains fixed and does not drift.

Within the context of the present invention, the term "droplet" is understood to refer to the molten metal (e.g., tin) that is dispensed into the vacuum chamber of an EUV light source before the molten metal is hit with a laser pulse. The term "pancake" is understood to refer to the molten metal after the molten metal is hit with a first laser pulse, but before the molten metal is converted to plasma (e.g., after the molten metal is hit with a pre-pulse, but before the molten metal is hit with a main pulse). Moreover, the term "observed plasma position" is understood to refer to a position at which the laser is observed (e.g., by a camera or other sensor) to hit the pancake. The term "target plasma position" is a predefined position at which it is desired for the laser to hit the pancake. Examples of the present disclosure may attempt to maintain a fixed plasma position by continuously monitoring the observed plasma position and making adjustments to the EUV light source as necessary to ensure that the plasma position is as close to the target plasma position as possible.

FIG. 1 is a schematic diagram illustrating one example of an extreme ultraviolet lithography light source 100, according to examples of the present disclosure. The discussion of FIG. 1 makes references to positions in an x,y,z coordinate plane. In one example, the x axis of the coordinate plane is defined along a line that is parallel to the direction in which the droplets travel (or perpendicular to the direction in which the laser pulses propagate). The z axis of the coordinate plane is defined along a line that is parallel to the direction in which the laser pulses propagate (or perpendicular to the direction in which the droplets travel). The y axis of the coordinate system is defined along a line that is perpendicular to both the x axis and the z axis.

As discussed above, the system 100 generally comprises a vacuum chamber 102, a laser power source 104, and a droplet generator 106.

The droplet generator 106 comprises a vessel that is configured to dispense a continuous stream of microscopic droplets, where the droplets are formed of a metal material in either liquid or solid form. For instance, in one example, the droplets are formed from molten tin. However, in other examples, the droplets may be formed from other materials, such as tin-containing liquid materials (e.g., eutectic alloys containing tin, lithium, and xenon).

In one example, the droplet generator 106 may include a gas supplier or other system (not shown) that is configured to pump a gas that forces the droplets out of the droplet generator 106 (e.g., via a nozzle). In this case, the flow velocity of the continuous stream of droplets may be a function of the pressure of the gas being pumped. For instance, when the gas pressure is increased, the flow velocity may be faster; conversely, when the gas pressure is decreased, the flow velocity may be slower.

In one example, each droplet may have a diameter of approximately twenty-five to thirty microns, and the droplet generator 106 may dispense the droplets at a rate of approximately 50,000 droplets per second, or fifty kilohertz.

The droplet generator 106 is coupled to the vacuum chamber 102. The vacuum chamber 102 comprises an interior volume that is maintained in a vacuum environment. The droplet generator 106 may dispense the continuous stream of droplets into the vacuum environment of the vacuum chamber 102. For instance, the droplet generator 106 may be positioned near an inlet on the top of the vacuum chamber 102 and may dispense the droplets into the vacuum chamber 102 so that the droplets fall toward the bottom of the vacuum chamber 102. As discussed above, the droplets dispensed by the droplet generator 106 may have a generally spherical form, as shown by the droplet 120.

The laser power source 104 is also coupled to the vacuum chamber 102. In one example, the laser power source 104 generally comprises a seed laser 108, a set of power amplifiers 110, and a beam transport system (BTS) 112. In one example, the seed laser 108 is a twenty to thirty kilowatt carbon dioxide ($CO_2$) laser source. However, in other examples, the seed laser 108 may comprise another type of laser source, such as a neodymium-doped yttrium aluminum garnet (Nd:YAG) laser source. The seed laser 108 may comprise a single laser or multiple lasers. The seed laser 108 is configured to generate a plurality of laser pulses, including a pre-pulse and a main pulse. The laser pulses may have a specific spot size (e.g., approximately 100 to 300 microns). In one example, the laser pulses are generated by the seed laser 108 at the same rate that the droplets are dispensed by the droplet generator 106. However, as discussed in greater detail below, the rate at which the laser pulses are generated may be adjusted to maintain a fixed plasma position within the vacuum chamber 102. In another example, the seed laser 108 may include a pre-amplifier (e.g., a high gain carbon dioxide amplifier) which may perform an initial amplification of the laser pulses (e.g., up to a magnitude of approximately 100 watts).

In one example, the set of power amplifiers 110 comprises a plurality of amplifiers that amplify, in a plurality of stages, the laser pulses generated by the seed laser 108. In one example, the laser pulses may be amplified to up to tens of kilowatts of average pulse power and multiple megawatts of peak pulse power. Thus, the set of power amplifiers 110 may provide most of the amplification that is needed to reach power levels that are high enough to generate EUV radiation in the vacuum chamber 102.

In one example, the BTS 112 comprises a set of optics (e.g., a periscope and/or mirrors, including M120 and/or M150 mirrors, which may be coated to minimize absorption of light from the laser) that is configured to expand the beams of the laser pulses and to steer the beams to a specific, predefined position in the vacuum chamber 102 (e.g., toward the stream of droplets). In one example, the BTS 112 may transport the beams up to thirty meters in the direction of the vacuum chamber 102. Thus, the beams of the laser pulses are steered or controlled to maximize the generation of EUV radiation. In one example, the BTS 112 may also include a second feedback generator 124 that adjusts the BTS 112 (e.g., adjusts the angle and/or direction in which the beams are steered) in an effort to maintain a fixed plasma position in the vacuum chamber, as discussed in greater detail below.

In one example, the laser power source 104 may further comprise a controller 126. The controller 126 may adjust the power of the laser light source 104 (e.g., by adjusting the output of the set of power amplifiers 110) in response to an intensity of photons emitted by the plasma in the vacuum chamber 102. For instance, the controller 126 may adjust the amplifiers to increase or decrease the amplification of the laser pulses emitted by the seed laser 108.

As discussed above, the vacuum chamber 102 comprises a vessel or volume within which the EUV radiation is generated. The vacuum chamber 102 may include one or more sensors 114. In one example, the sensors 114 may include a plurality of cameras positioned in different locations within the vacuum chamber 102. In this case, the plurality of cameras may include multiple different types of cameras that are configured and positioned to capture different types of information. For instance, the vacuum chamber may include a coarse droplet source camera (CDSC) to capture images of droplet locations within the vacuum chamber 102, a fine droplet source camera (FDSC) to capture images of pancakes within the vacuum chamber 102, and one or more other types of cameras. In one example, the sensors 114 are positioned to monitor the positions of the pre-pulse and the main pulse in the vacuum chamber, i.e., where the pre-pulse hits the droplet 120 and where the main pulse hits the pancake 122. For instance, where the sensors 114 include cameras, the cameras may capture images of the pre-pulse and the main pulse as they hit the droplet 120 and the pancake 122, respectively.

The system 100 comprises further elements that assist in controlling the plasma position (i.e., the position at which the pancake 122 is vaporized) within the vacuum chamber 102. In one example, these further elements include a first feedback generator (FG) 116 and a controller 118.

Figure 2:
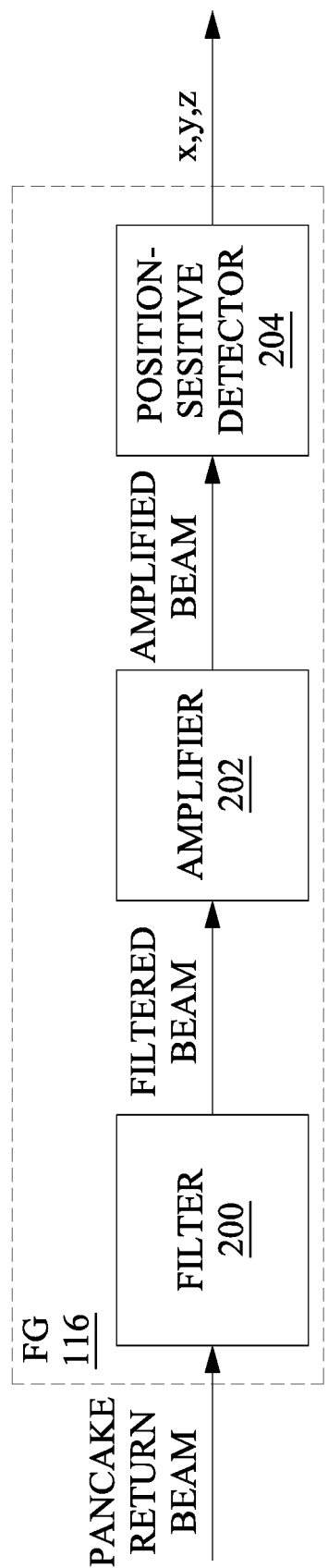
FIG. 2 is a schematic diagram illustrating one example of the first feedback generator of FIG. 1.

FIG. 2 is a schematic diagram illustrating one example of the first feedback generator 116 of FIG. 1. In one example, the first feedback generator 116 comprises a filter 200, an amplifier 202, and a position-sensitive detector 204. The filter 200 may be configured to extract a pancake return beam from images provided by the sensor 114. In one example, the pancake return beam comprises laser light that is reflected by the pancake 122 when the main pulse hits the pancake 122. In one example, the filter 200 may extract the pancake return beam from an image by filtering the light from the laser pre-pulse and the light from the laser main pulse from the image. In one example, the filter 200 may comprise a mirror having a coating, such as a dichroic mirror. Once the pre-pulse light and main pulse light have been filtered from the image, the image may be delivered to the amplifier 202, which amplifies the return beam in the image. The position-sensitive detector 204 receives the amplified and filtered image and determines, based on the optical beam deflection in the image, the x,y,z coordinates of the observed plasma position in the vacuum chamber 102. In one example, the position-sensitive detector 204 is a quad-cell photodetector array.

Referring back to FIG. 1, the position-sensitive detector 204 may provide the x coordinate of the observed plasma position to the controller 118. In turn, the controller 118 may adjust the time delay between the pre-pulse and the main pulse, based on the location of the observed plasma position's x coordinate relative to the target plasma position's x coordinate. For instance, if the x coordinate of the observed plasma position is the same (or is within some acceptable predefined tolerance of) the x coordinate of the target plasma position, then the controller 118 may leave the time delay as it is. However, if the x coordinate of the observed plasma position is not the same (or is not within the acceptable predefined tolerance of) the x coordinate of the target plasma position, then the controller 118 may shorten or lengthen the time delay as necessary until the x coordinate of the observed plasma position is the same (or is within the acceptable predefined tolerance of) the x coordinate of the target plasma position.

Adjustment of the time delay may therefore adjust the position (i.e., at least the x position) of the pancake relative to the plasma. As a result, the position at which the main pulse hits the pancake (i.e., the plasma position) may be adjusted simply by controlling the time at which the main pulse is fired relative to the pre-pulse (which may allow the pancake to fall a slightly shorter distance or a slightly longer distance before the pancake is vaporized). Thus, the position-sensitive detector 204 and the controller 118 may comprise a first feedback loop that allows the plasma position to be adjusted without adjusting a position of the laser power source 104 or the droplet generator 106. In one example, the controller 118 may comprise a quad-cell timing loop.

The position-sensitive detector 204 may also provide the y and z coordinates of the observed plasma position to the BTS 112 in a second feedback loop. The second feedback generator 124 of the BTS 112 may adjust the BTS 112 in response to the y and z coordinates of the observed plasma position (e.g., by adjusting the angles and/or positions of one or more mirrors used to guide the beams, such as the M120 and/or M150 mirrors of the BTS 112). For instance, if the y and z coordinates of the observed plasma position are the same as (or are within an acceptable predefined tolerance of) the y and z coordinates of the target plasma position, then the BTS 112 may not be adjusted. However, if the y and z coordinates of the observed plasma position are not the same as (or are not within an acceptable predefined tolerance of) the y and z coordinates of the target plasma position, then the second feedback generator 124 of the BTS 112 may adjust the BTS 112 in the y and/or z axis so that the beams delivered by the BTS 112 into the vacuum chamber 102 hit the pancakes at the target plasma position. Thus, the plasma position can be further fixed by adjusting the positions of the laser beams in the y and z axes relative to the droplets and pancakes.

However, adjusting the y and/or z positions of the beams may change the locations in which portions of the droplets which are not vaporized fall. That is, as the stream of droplets flows into the vacuum chamber 102 and is vaporized by the laser pulses, some portions of the droplets may fail to be vaporized (e.g., a laser pulse may miss all or a portion of a droplet despite the best efforts to precisely control the plasma position). The portions of a droplet that are not vaporized may fall to the bottom of the vacuum chamber 102, where the portions of the droplet may be caught by a droplet catcher (not shown). The droplet catcher collects the portions of the droplets that fail to be vaporized, so that these portions of the droplets do not build up on the interior surfaces of the vacuum chamber 102. Buildup of molten metal on the interior surfaces of the vacuum chamber 102 may degrade the performance of the system 100 and reduce the conversion efficiency.

In one example, the vacuum chamber 102 may further include a droplet generator (DG) metrology 128. The droplet generator metrology 128 may observe the metrology of the droplets that are dispensed by the droplet generator 106 (e.g., droplet 120 and the like). More specifically, the droplet generator metrology 128 may observe the y and z positions of the droplets and may control the position of the droplet generator 106 to ensure that the droplets are not dispensed in a position where any portions of the droplets that are not vaporized may land outside of the droplet catcher. Thus, the droplet generator metrology 128 may provide feedback to the droplet generator 106 in a third feedback loop to ensure that any adjustments made to the BTS 112 do not result in excess droplet buildup outside of the droplet catcher.

It will be appreciated that FIG. 1 represents a simplified form of a EUV light source 100. In some examples, the EUV light source 100 may include additional components that are not illustrated, such as a collector and a droplet catcher. The collector may comprise a multilayer mirror off of which the photons of the EUV radiation are reflected and directed through an intermediate focus unit, which is positioned outside of the vacuum chamber 102. The droplet catcher may be positioned to collect portions of the droplets that are not vaporized by the laser pulses and that fall to the bottom of the vacuum chamber 102.

Figure 3:
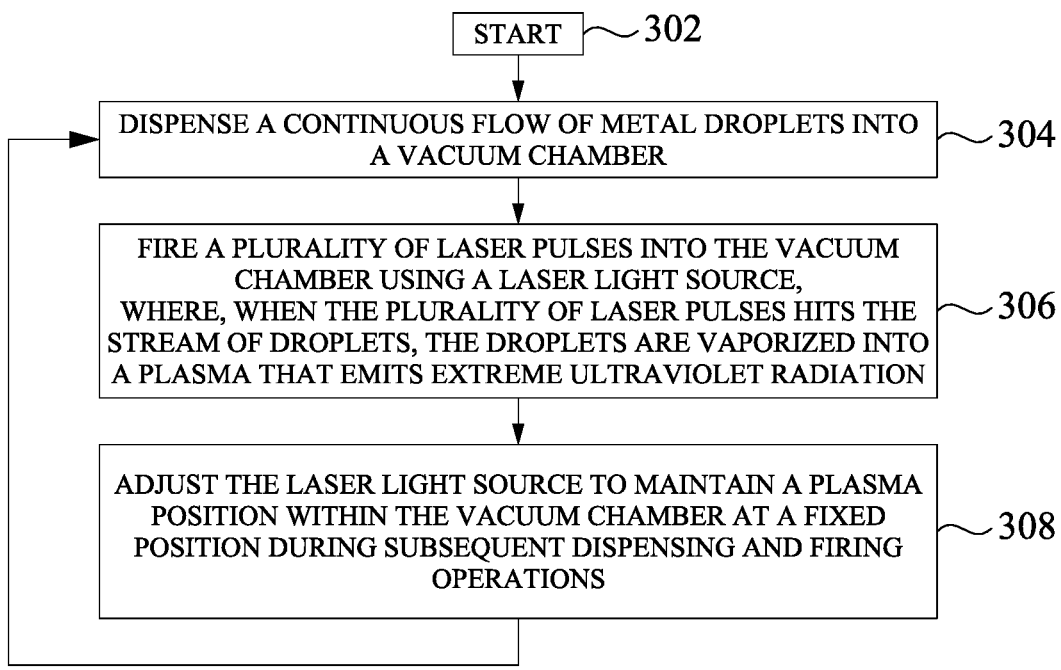
FIG. 3 is a flow diagram illustrating a method for controlling the position of a plasma in an extreme ultraviolet lithography light source, according to one example of the present disclosure.

FIG. 3 is a flow diagram illustrating a method 300 for controlling the position of a plasma in an extreme ultraviolet lithography light source, according to one example of the present disclosure. The method 300 may be performed using one or more different components of a laser produced plasma EUV light source, under the control of controller or processor.

The method 300 begins in step 302. In step 304, a continuous flow of metal droplets may be dispensed into a vacuum chamber. As discussed above, the droplets may be spherical in shape and may have a diameter of approximately twenty-five to thirty microns. The droplets may be dispensed at a rate of approximately 50,000 droplets per second, or fifty kilohertz. The droplets may comprise tin or a tin-containing liquid material (e.g., eutectic alloys containing tin, lithium, and xenon) in liquid or solid form.

In step 306, a plurality of laser pulses (including at least a first and a second pulse) may be fired into the vacuum chamber. As discussed above, the plurality of laser pulses may be generated from a twenty to thirty kilowatt carbon dioxide $CO_2$ laser source and may be amplified prior to entering the vacuum chamber. The plurality of laser pulses may have a specific spot size (e.g., approximately 100 to 300 microns). When the first laser pulse hits a droplet in the vacuum chamber, the previously spherical droplet takes on a pancake-like shape. When the second laser pulse hits the pancake, the pancake is vaporized into a highly ionized plasma that emits EUV radiation.

In step 308, the laser light source may be adjusted to maintain a plasma position within the vacuum chamber at a fixed position during subsequent dispensing and firing operations. As discussed above, the plasma position is a position within the vacuum chamber at which the droplets are vaporized to form the plasma.

The method 300 may then return to step 304 and continue as described above. Thus, the method 300 may continuously loop through the steps 304-308 during an EUV lithography process, to ensure that the plasma position remains fixed throughout the EUV lithography process.

Figure 4:
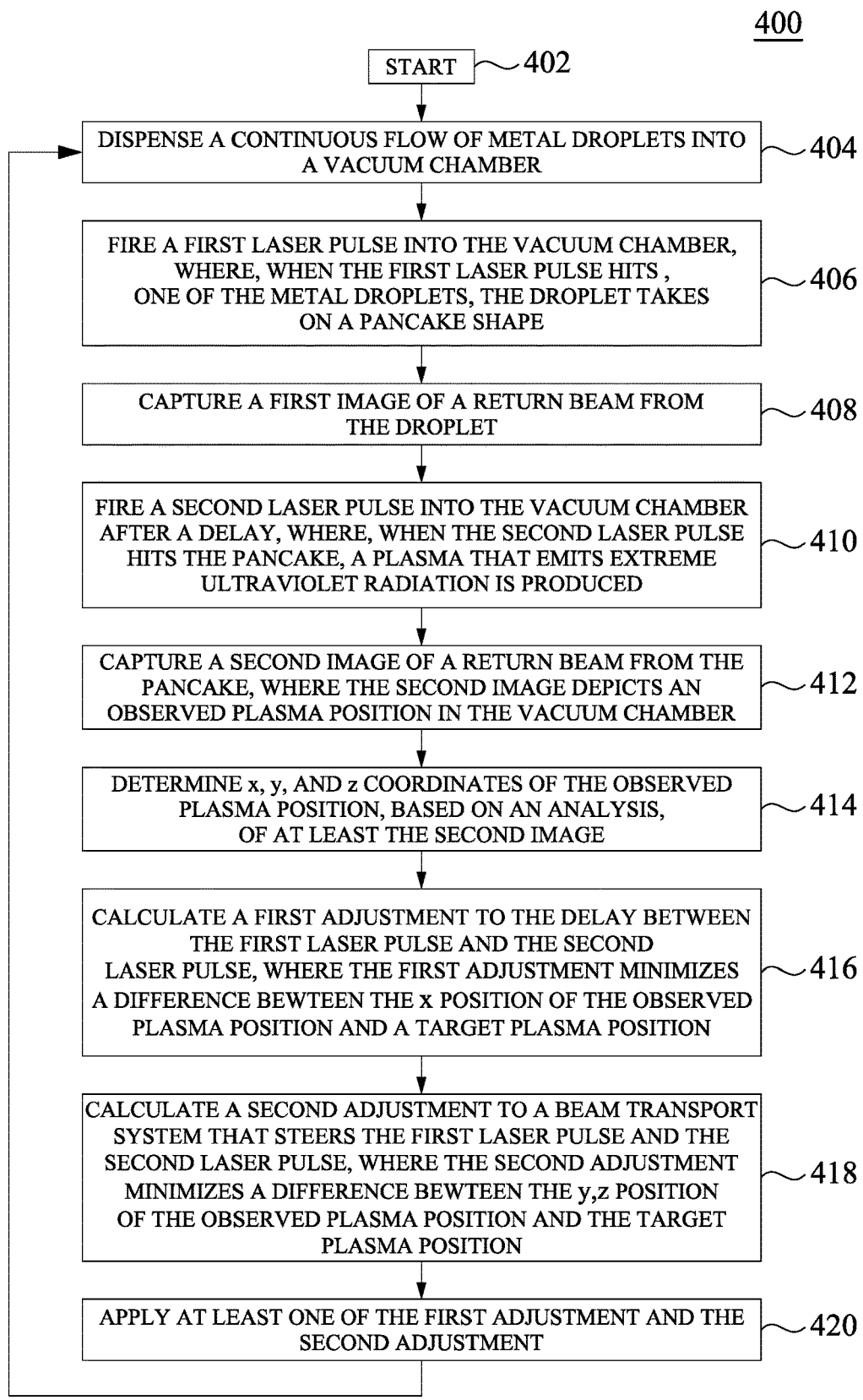
FIG. 4 is a flow diagram illustrating a method for controlling the position of a plasma in an extreme ultraviolet lithography light source, according to another example of the present disclosure.

FIG. 4 is a flow diagram illustrating a method 400 for controlling the position of a plasma in an extreme ultraviolet lithography light source, according to another example of the present disclosure. The method 400 may be viewed as a more detailed version of the method 300, discussed above. Thus, the method 400 may be performed using one or more different components of a laser produced plasma EUV light source, under the control of controller or processor.

The method 400 begins in step 402. In step 404, a continuous flow of metal droplets may be dispensed into a vacuum chamber. As discussed above, the droplets may be spherical in shape and may have a diameter of approximately twenty-five to thirty microns. The droplets may be dispensed at a rate of approximately 50,000 droplets per second, or fifty kilohertz. The droplets may comprise tin or a tin-containing liquid material (e.g., eutectic alloys containing tin, lithium, and xenon) in liquid or solid form.

In step 406, a first laser pulse (e.g., a pre-pulse) may be fired into the vacuum chamber. As discussed above, the first laser pulse may be generated from a twenty to thirty kilowatt carbon dioxide $CO_2$ laser source and may be amplified prior to entering the vacuum chamber. The first laser pulse may have a specific spot size (e.g., approximately 100 to 300 microns) When the first laser pulse hits a droplet in the vacuum chamber, the previously spherical droplet takes on a pancake-like shape.

In step 408, a first image of a return beam from the droplet (e.g., a portion of the laser light from the first laser pulse that is reflected upon impact with the droplet) may be captured. In one example, the first image may be captured by a camera that is positioned within the vacuum chamber, such as a coarse droplet source camera.

In step 410, a second laser pulse (e.g., a main pulse) may be fired into the vacuum chamber, after a delay (where the delay defines a time difference between the first laser pulse and the second laser pulse). Like the first laser pulse, the second laser pulse may be generated from a twenty to thirty kilowatt carbon dioxide $CO_2$ laser source and may be amplified prior to entering the vacuum chamber. The second laser pulse may have a specific spot size (e.g., approximately 100 to 300 microns). When the second laser pulse hits the pancake, the pancake is vaporized into a highly ionized plasma that emits EUV radiation.

In step 412, a second image of a return beam from the pancake (e.g., a portion of the laser light from the first and/or second laser pulse that is reflected upon impact with the pancake) may be captured. Thus, the second image may depict an observed plasma position in the vacuum chamber. In one example, the second image may be captured by a camera that is positioned within the vacuum chamber, such as a fine droplet source camera.

In step 414, x, y, and z coordinates of the observed plasma position may be determined, based on an analysis of at least the second image. For instance, in one example, the second image may be processed to remove light from the first and second laser pulses and to amplify the return beam from the pancake. The x, y, and z coordinates of the observed plasma position may then be determined based on optical beam deflection. The x coordinate may represent a position of the observed plasma position along a line that is parallel to the direction in which the droplets flow. The z coordinate may represent a position of the observed plasma position along a line that is parallel to the propagation of the laser pulses. The y coordinate may represent a position of the observed plasma position along a line that is perpendicular to both the x axis and the z axis.

In step 416, a first adjustment to the delay between the first laser pulse and the second laser pulse may be calculated, where the first adjustment minimizes a difference in the x position between the observed plasma position and a target plasma position. In one example, where the difference in x position is zero or is within some predefined tolerance, the first adjustment may not be necessary.

In step 418, a second adjustment to a beam transport system that steers the beams of the first and second laser pulses may be calculated, where the second adjustment minimizes a difference in the y,z position between the observed plasma position and the target plasma position. In one example, the second adjustment may involve making adjustments to the positions and/or angles of one or more mirrors of the beam transport system (e.g., an M120 and/or M150 mirror). In one example, where the difference in y,z position is zero or is within some predefined tolerance, the second adjustment may not be necessary.

In step 420, at least one of the first adjustment and the second adjustment is applied to the EUV light source. For instance, application of the first adjustment may result in a change to the time delay between the firing of the first laser pulse and the second laser pulse (e.g., the time delay may be made shorter or longer). Application of the second adjustment may result in the angle and/or direction at which the beams of the first laser pulse and the second laser pulse are steered into the vacuum chamber. As discussed above, one or both of the first adjustment and the second adjustment may not be necessary at any given time.

The method 400 may then return to step 404 and continue as described above. Thus, the method 400 may continuously loop through the steps 404-420 during an EUV lithography process, to ensure that the plasma position remains fixed at the target plasma position throughout the EUV lithography process. As noted above, some iterations of the method 400 may result in no adjustments to the EUV light source. For instance, the first adjustment may be determined to be necessary, while the second adjustment may be determined to not be necessary, or vice versa. Alternatively, neither of the first adjustment and the second adjustment may be determined to be necessary if the plasma position has not changed (or has changed within some predefined tolerance). However by continuously monitoring the observed plasma position, it can be quickly determined when any adjustments are necessary, and the adjustments may be made in a timely manner to maintain the fixed plasma position.

It should be noted that the methods 300 and 400 may be expanded to include additional steps or may be modified to include additional operations with respect to the steps outlined above. In addition, although not specifically specified, one or more steps, functions, or operations of the methods 300 and 400 may include a storing, displaying, and/or outputting step as required for a particular application. In other words, any data, records, fields, and/or intermediate results discussed in the methods 300 and 400 can be stored, displayed, and/or outputted either on the device executing the method or to another device, as required for a particular application. Furthermore, steps, blocks, functions or operations of the above described methods 300 and 400 can be combined, separated, and/or performed in a different order from that described above, without departing from the examples of the present disclosure.

Thus, examples of the present disclosure provide plasma position control for EUV light sources. The control techniques described above may be implemented to main the plasma position (e.g., the position at which the main pulse hits the pancake to produce the plasma) at a fixed position within a vacuum chamber. By maintaining this fixed position, the effects of conditions which may reduce the conversion efficiency of the light source (such as drift of the laser beams or changes in the plasma position) can be minimized.

In one example, the present disclosure provides a system that includes a vacuum chamber, a droplet generator, a laser light source, a sensor, and a first feedback loop. The droplet generator may dispense a stream of droplets into the vacuum chamber, where the droplets may be formed from a metal material. The laser light source may fire a plurality of laser pulses, including at least a first pulse and a second pulse, into the vacuum chamber. The sensor may detect an observed plasma position within the chamber, where the observed plasma position is a position at which the plurality of laser pulses vaporizes a droplet of the stream of droplets to produce a plasma. The plasma emits extreme ultraviolet radiation which may be used to etch a semiconductor wafer. The first feedback loop may connect the sensor to the laser light source and may adjust a time delay between the first pulse and the second pulse. The adjustment to the time delay may minimize a difference between the observed plasma position and a target plasma position.

In another example, the present disclosure provides a system that includes a vacuum chamber, a droplet generator, a laser light source, a sensor, and a feedback loop. The droplet generator may dispense a stream of droplets into the vacuum chamber, where the droplets may be formed from a metal material. The laser light source may fire a plurality of laser pulses, including at least a first pulse and a second pulse, into the vacuum chamber. The sensor may detect an observed plasma position within the chamber, where the observed plasma position is a position at which the plurality of laser pulses vaporizes a droplet of the stream of droplets to produce a plasma. The plasma emits extreme ultraviolet radiation which may be used to etch a semiconductor wafer. The first loop may connect the sensor to the laser light source and may adjust a trajectory of the plurality of laser pulses. The adjustment to the trajectory may minimize a difference between the observed plasma position and a target plasma position.

In another example, a stream of droplets is dispensed into a vacuum chamber. The droplets are formed from a metal material. A plurality of laser pulses is fired at the stream of droplets, using a laser light source. When the plurality of laser pulses hits the droplets, the droplets are vaporized into a plasma that emits extreme ultraviolet radiation. The laser light source is adjusted to maintain a plasma position within the vacuum chamber that is fixed. The plasma position is a position within the vacuum chamber at which the droplets are vaporized.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
 a vacuum chamber;
 a droplet generator to dispense a stream of droplets into the vacuum chamber, wherein the droplets are formed from a metal material;
 a laser light source to fire a plurality of laser pulses, including at least a pre-pulse and a main pulse, into the vacuum chamber;
 a sensor to detect an observed plasma position within the vacuum chamber and capture a first image of a return beam of the pre-pulse from a droplet of the stream of droplets when the pre-pulse hits the droplet and prior to the main pulse hitting the droplet, wherein the observed plasma position comprises a position at which the plurality of laser pulses vaporizes the droplet of the stream of droplets to produce a plasma that emits extreme ultraviolet radiation; and a first feedback loop connecting the sensor to the laser light source, wherein the first feedback loop adjusts a time delay between the pre-pulse and the main pulse to minimize a difference between the observed plasma position and a target plasma position.

2. The system of claim 1, wherein the metal material comprises tin.

3. The system of claim 1, wherein the laser light source comprises a carbon dioxide seed laser.

4. The system of claim 1, wherein the first feedback loop comprises:

a first feedback generator to extract x,y,z coordinates of the observed plasma position from a second image captured by the sensor, wherein the second image depicts a portion of the main pulse that is reflected at the observed plasma position; and a controller to calculate an adjustment to the time delay based on an x component of the x,y,z coordinates.

5. The system of claim 4, wherein the x component is defined along a line that is parallel to a direction of travel of the stream of droplets.

6. The system of claim 4, wherein the laser light source further comprises:

a beam transport system to steer the plurality of laser pulses toward the stream of droplets.

7. The system of claim 6, further comprising:

a second feedback loop connecting the sensor to the beam transport system, wherein the second feedback loop adjusts a trajectory of the plurality of laser pulses to minimize the difference between the observed plasma position and the target plasma position.

8. The system of claim 7, wherein the second feedback loop comprises:

the first feedback generator; and a second feedback generator in the beam transport system to calculate an adjustment to a mirror of the beam transport system based on a y component and a z component of the x,y,z coordinates.

9. The system of claim 8, wherein the mirror is an M150 mirror.

10. The system of claim 8, wherein the z component is defined along a line that is parallel to a direction of propagation of the plurality of laser pulses.

11. A system, comprising:

a vacuum chamber;

a droplet catcher in the vacuum chamber;

a droplet generator to dispense a stream of droplets into the vacuum chamber and to the droplet catcher, wherein the droplets are formed from a metal material;

a laser light source to fire a plurality of laser pulses, including at least a first pulse and a second pulse, into the vacuum chamber;

a sensor to detect an observed plasma position within the vacuum chamber, wherein the observed plasma position comprises a position at which the plurality of laser pulses vaporizes a droplet of the stream of droplets to produce a plasma that emits extreme ultraviolet radiation;

a feedback loop connecting the sensor to the laser light source, wherein the feedback loop adjusts a trajectory of the plurality of laser pulses to minimize a difference between the observed plasma position and a target plasma position; and a droplet generator metrology connecting the droplet generator to provide a feedback to control a position of the droplet generator based on a position of the droplet catcher and the target plasma position after adjusting the trajectory of the plurality of laser pulses.

12. A method, comprising:

dispensing a stream of droplets into a vacuum chamber, wherein the droplets are formed from a metal material;

firing a plurality of laser pulses at the stream of droplets, using a laser light source, wherein when the plurality of laser pulses hits the droplets, the droplets are vaporized into a plasma that emits extreme ultraviolet radiation, the plurality of laser pulses comprises a pre-pulse and a main pulse, and when the pre-pulse hits the droplets, a shape of the droplets transforms from spherical to a shape of a pancake;

capturing a first image of a return beam of the pre-pulse from one of the droplets when the pre-pulse hits said one of the droplets and prior to the main pulse hitting said one of the droplets; and adjusting the laser light source to maintain a plasma position within the vacuum chamber that is fixed based on at least the first image, wherein the plasma position is a position within the vacuum chamber at which the droplets are vaporized.

13. The method of claim 12, wherein the adjusting comprises:

determining x,y,z coordinates of an observed plasma position, wherein an observed plasma position comprises a position in the vacuum chamber at which the plurality of laser pulses is observed to vaporize a droplet of the stream of droplets; and adjusting a time delay between the pre-pulse and the main pulse of the plurality of laser pulses, based on the first image and an x component of the x,y,z coordinates, wherein adjusting the time delay minimizes a difference between the observed plasma position and the fixed plasma position.

14. The method of claim 13, wherein when the main pulse hits the pancake, the pancake is vaporized.

15. The method of claim 13, wherein the x component is defined along a line that is parallel to a direction of travel of the stream of droplets.

16. The method of claim 13, further comprising:

adjusting a trajectory of the plurality of laser pulses to further minimize the difference between the observed plasma position and the fixed plasma position.

17. The method of claim 16, wherein the adjusting the trajectory comprises adjusting a mirror of a beam transport system of the laser light source.

18. The method of claim 16, wherein the adjusting adjusts the trajectory along a line that is parallel to a direction in which the plurality of laser pulses propagates.

19. The method of claim 12, wherein the metal material comprises tin.

20. The method of claim 12, wherein the laser light source comprises a carbon dioxide seed laser.

* * * * *